US012813121B2

(12) United States Patent
Kim et al.

(10) Patent No.: US 12,813,121 B2
(45) Date of Patent: Nov. 24, 2026

(54) ORGANIC LIGHT-EMITTING DISPLAY APPARATUS AND METHOD FOR MANUFACTURING THE SAME

(71) Applicant: LG Display Co., Ltd., Seoul (KR)

(72) Inventors: Daehee Kim, Goyang-si (KR); Jongchan Son, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 415 days.

(21) Appl. No.: 18/057,719

(22) Filed: Nov. 21, 2022

(65) Prior Publication Data

US 2023/0200173 A1 Jun. 22, 2023

(30) Foreign Application Priority Data

Dec. 16, 2021 (KR) ........................ 10-2021-0180276

(51) Int. Cl.
*H10K 50/828* (2023.01)
*H10K 59/35* (2023.01)
(Continued)

(52) U.S. Cl.
CPC ......... *H10K 59/353* (2023.02); *H10K 50/828* (2023.02); *H10K 59/351* (2023.02); *H10K 2102/103* (2023.02); *H10K 2102/351* (2023.02)

(58) Field of Classification Search
CPC ....... H10K 50/805–828; H10K 59/351; H10K 59/353; H10K 2102/10–20;
(Continued)

(56) References Cited

U.S. PATENT DOCUMENTS

2014/0191202 A1* 7/2014 Shim .................... H10K 59/876 257/40
2014/0354141 A1 12/2014 Lee et al.
(Continued)

FOREIGN PATENT DOCUMENTS

CN 106560934 A 4/2017
CN 110301053 A 10/2019
(Continued)

OTHER PUBLICATIONS

Choi et al., "Ag Fiber/IZO Composite Electrodes: Improved Chemical and Thermal Stability and Uniform Light Emission in Flexible Organic Light-emitting Diodes", Scientific Reports, vol. 9, Article No. 738, Jan. 24, 2019, pp. 1-7.
(Continued)

*Primary Examiner* — Steven B Gauthier
*Assistant Examiner* — Adam D Weiland
(74) *Attorney, Agent, or Firm* — Seed Intellectual Property Law Group LLP

(57) ABSTRACT

The present disclosure provides an organic light-emitting display apparatus and method for manufacturing the same. The organic light-emitting display apparatus includes a pixel including a first sub-pixel, a second sub-pixel, a third sub-pixel and a fourth sub-pixel; wherein each of the first to fourth sub-pixels includes an organic light-emitting element including an anode electrode, an organic light-emitting layer disposed on the anode electrode, and a cathode electrode disposed on the organic light-emitting layer, wherein a thickness of the cathode electrode disposed in the fourth sub-pixel is larger than a thickness of the cathode electrode disposed in each of the first to third sub-pixels.

18 Claims, 7 Drawing Sheets

(51) Int. Cl.
*H10K 102/00* (2023.01)
*H10K 102/10* (2023.01)

(58) Field of Classification Search
CPC ....... H10K 2102/103; H10K 2102/351; H10K 85/00–791; H10K 50/00–88; H10K 59/00–95; H10K 65/00; H10K 71/00–861; H10K 2101/00–90; H10K 2102/00–361; B32B 2457/206
See application file for complete search history.

(56) References Cited

U.S. PATENT DOCUMENTS

| | | | | |
|---|---|---|---|---|
| 2018/0151824 | A1 | 5/2018 | Park et al. | |
| 2018/0166511 | A1* | 6/2018 | Niboshi | G02B 5/20 |
| 2019/0181189 | A1* | 6/2019 | Chang | H10K 59/38 |
| 2020/0075693 | A1* | 3/2020 | Polyakov | H10K 59/38 |
| 2020/0280017 | A1* | 9/2020 | Helander | H10K 59/80522 |
| 2021/0175457 | A1* | 6/2021 | Park | H10K 50/11 |
| 2021/0183900 | A1* | 6/2021 | Choi | H10K 59/80515 |
| 2023/0109576 | A1* | 4/2023 | Uchida | H10K 59/122 257/89 |

FOREIGN PATENT DOCUMENTS

| | | | | | |
|---|---|---|---|---|---|
| CN | 113345939 | A | | 9/2021 | |
| KR | 10-2014-0124615 | A | | 10/2014 | |
| KR | 10-2015-0043827 | A | | 4/2015 | |
| KR | 20180061612 | A | | 6/2018 | |
| KR | 20180079104 | A | * | 7/2018 | H01L 51/5218 |
| KR | 10-2020-0013353 | A | | 2/2020 | |

OTHER PUBLICATIONS

Qicheng Xing, "Colorimetry". Dec. 31, 1979. (439 pages).

* cited by examiner

ORGANIC LIGHT-EMITTING DISPLAY APPARATUS AND METHOD FOR MANUFACTURING THE SAME

CROSS-REFERENCE TO RELATED APPLICATION

This application claims priority from Korean Patent Application No. 10-2021-0180276 filed on Dec. 16, 2021 in the Korean Intellectual Property Office, and all the benefits accruing therefrom under 35 U.S.C. 119, the contents of which in its entirety are herein incorporated by reference.

BACKGROUND

Technical Field

The present disclosure relates to an organic light-emitting display apparatus, and more specifically, an organic light-emitting display apparatus in which external moisture may be prevented from invading an organic light-emitting element and light-emitting efficiency may be improved.

Description of Related Art

As society enters full-fledged information age, various display apparatuses that process and display a large amount of information have been developed. There are various types of display apparatuses that display images, such as a liquid crystal display apparatus (LCD), an organic light-emitting display apparatus (OLED), and a quantum dot display apparatus (QD).

The organic light-emitting display apparatus (OLED) includes a display area where an image is displayed and a non-display area surrounding the display area. A plurality of pixel areas are arranged in the display area of the organic light-emitting display apparatus. A plurality of organic light-emitting elements corresponding to the plurality of pixel areas are included in the apparatus. The organic light-emitting element is self-emissive. Thus, the organic light-emitting display apparatus has advantages of faster response speed, greater light-emitting efficiency, luminance and viewing angle, and excellent contrast ratio and color gamut, compared to a liquid crystal display apparatus.

BRIEF SUMMARY

The organic light-emitting element includes an organic material that may be easily degraded by moisture. There is a problem in that the organic light-emitting element is deteriorated by moisture introduced from an outside, and thus a life of the organic light-emitting element is shortened.

Further, in an organic light-emitting display apparatus in a top emission scheme, a transparent common cathode formed over an entire display area is used to constitute a plurality of organic light-emitting elements. When the common cathode is thick, there is a problem in that a short circuit between an anode and the cathode occurs due to foreign substances during a process. When the common cathode is thin to solve the problem caused by the foreign substances during the process, transmittance of light is lowered compared to that in a case where the common cathode is thick, so that light-emitting efficiency of the organic light-emitting display apparatus is lowered.

One or more embodiments of the present disclosure provide an organic light-emitting display apparatus in which external moisture may be prevented from invasion into the organic light-emitting element, and the light-emitting efficiency of the apparatus may be improved.

Technical benefits of the present disclosure are not limited to the above-mentioned benefits. Other benefits and advantages of the present disclosure that are not mentioned may be understood based on following descriptions, and may be more clearly understood based on embodiments of the present disclosure. Further, it will be easily understood that the technical benefits and advantages of the present disclosure may be realized using means shown in the claims and combinations thereof.

One embodiment of the present disclosure provides an organic light-emitting display apparatus comprising: a pixel including a first sub-pixel, a second sub-pixel, a third sub-pixel and a fourth sub-pixel; wherein each of the first to fourth sub-pixels includes an organic light-emitting element including an anode electrode, an organic light-emitting layer disposed on the anode electrode, and a cathode electrode disposed on the organic light-emitting layer, wherein a thickness of the cathode electrode disposed in the fourth sub-pixel is larger than a thickness of the cathode electrode disposed in each of the first to third sub-pixels.

Another embodiment of the present disclosure provides an organic light-emitting display apparatus comprising: a pixel including a first sub-pixel, a second sub-pixel and a third sub-pixel, wherein each of the first to third sub-pixels includes an organic light-emitting element including an anode electrode, an organic light-emitting layer disposed on the anode electrode, and a cathode electrode disposed on the organic light-emitting layer, wherein the apparatus comprises a barrier pattern covering the cathode electrode and disposed in each of the first and second sub-pixels.

Yet another embodiment of the present disclosure provides an organic light-emitting display apparatus comprising: a pixel including a red sub-pixel, a blue sub-pixel and a green sub-pixel; wherein each of the red sub-pixel, the blue sub-pixel and the green sub-pixel includes an organic light-emitting element including an anode electrode, an organic light-emitting layer disposed on the anode electrode, and a cathode electrode disposed on the organic light-emitting layer, wherein a thickness of the cathode electrode disposed in the green sub-pixel is larger than a thickness of the cathode electrode disposed in each of the red sub-pixel and the blue sub-pixel.

Still another embodiment of the present disclosure provides a method of manufacturing an organic light-emitting display apparatus, the method comprising: providing a substrate; forming a plurality of anode electrodes on the substrate so as to be respectively disposed in a plurality of sub-pixels; forming an organic light-emitting layer on the plurality of anode electrodes; forming a first cathode electrode on the organic light-emitting layer; forming a barrier layer on the first cathode electrode; forming a mask layer on the barrier layer; forming a first opening and second openings in the mask layer such that the first opening corresponds to one sub-pixel of the plurality of sub-pixels and each of the second openings correspond to each of boundary areas between adjacent ones of remaining sub-pixels of the plurality of sub-pixels; removing portions of the barrier layer respectively exposed through the first opening and the second openings to expose partial areas of the first cathode electrode; and forming a second cathode electrode on the partial areas of the first cathode electrode respectively exposed through the first opening and the second openings.

The specific details of other embodiments are included in the detailed description and drawings.

According to the embodiment of the present disclosure, the barrier pattern including fluoropolymer containing a large amount of fluorine may be formed in each sub-pixel and on the organic light-emitting element, such that the moisture introduced from the outside may be prevented from invading into the organic light-emitting element.

According to an embodiment of the present disclosure, the thickness of the cathode electrode of the green sub-pixel may be larger than the thickness of the cathode electrode of each of other sub-pixels adjacent thereto, such that the light-emitting efficiency of the green sub-pixel may be improved.

Further, according to the embodiment of the present disclosure, a short circuit defect between the anode electrode and the cathode electrode may be removed by increasing the thickness of only the cathode electrode of some of the sub-pixels instead of increasing the thicknesses of the cathode electrodes of all of the sub-pixels.

Effects of the present disclosure are not limited to the above-mentioned effects, and other effects as not mentioned will be clearly understood by those skilled in the art from following descriptions.

DETAILED DESCRIPTION

Figure 1A:
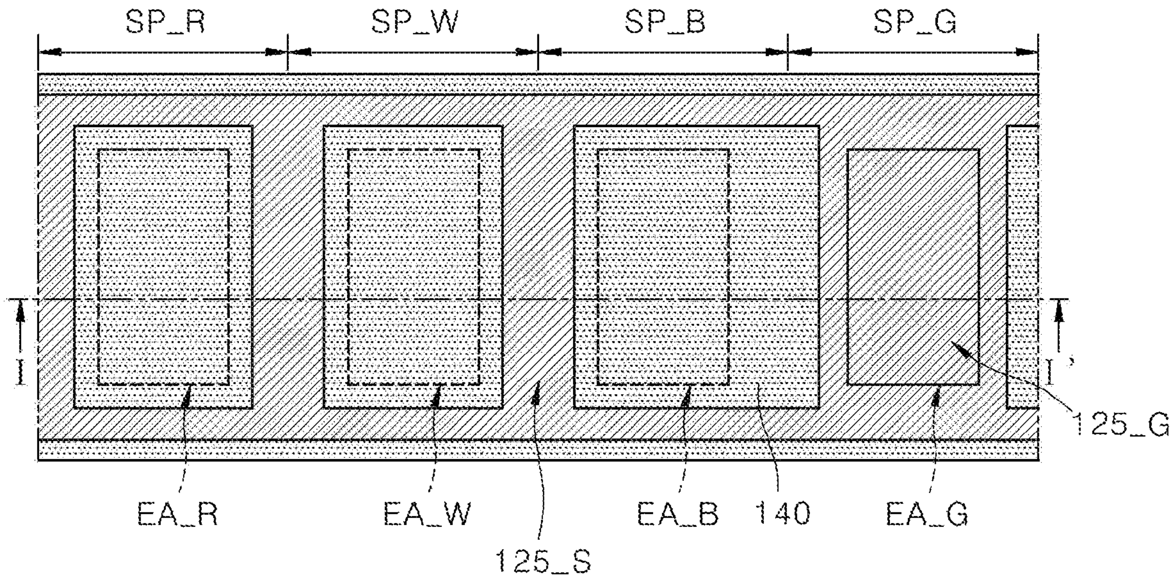
FIG. 1A and FIG. 1B are a plan view and a cross-sectional view showing an organic light-emitting display apparatus according to an embodiment of the present disclosure.

Advantages and features of the present disclosure, and a method of achieving the advantages and features will become apparent with reference to embodiments described later in detail together with the accompanying drawings. However, the present disclosure is not limited to embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, dimension (e.g., length, width, height, thickness, radius, diameter, area, etc.), a ratio, an angle, a number of elements, etc., disclosed in the drawings for describing the embodiments of the present disclosure are illustrative, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "comprising," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify an entirety of list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In interpreting a numerical value, the value is interpreted as including an error range unless there is separate explicit description thereof.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

In descriptions of temporal relationships, for example, temporal precedent relationships between two events such as "after," "subsequent to," "before," etc., another event may occur therebetween unless "directly after," "directly subsequent" or "directly before" is indicated.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display apparatus according to an embodiment of the present disclosure will be described in detail with reference to the accompanying drawings.

Figure 1B:
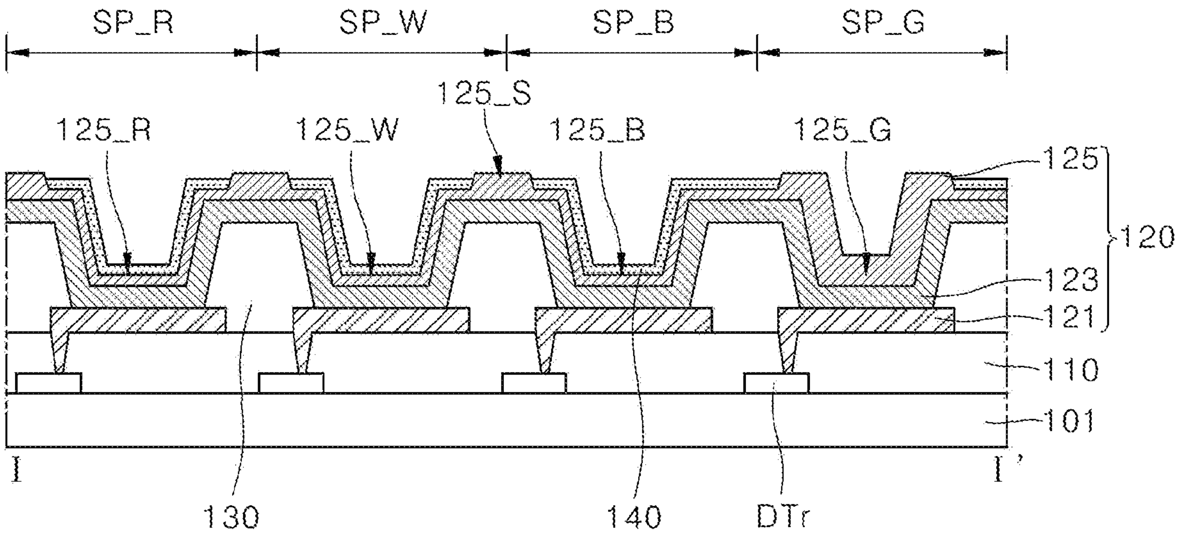

FIG. 1A and FIG. 1B are a plan view and a cross-sectional view showing an organic light-emitting display apparatus according to an embodiment of the present disclosure.

Referring to FIG. 1A and FIG. 1B, an organic light-emitting display apparatus according to an embodiment of the present disclosure may include a plurality of pixels in a display area, and each pixel may include a plurality of sub-pixels. In this embodiment, each pixel includes four sub-pixels, for example, a red sub-pixel SP_R, a white sub-pixel SP_W, a blue sub-pixel SP_B, and a green sub-pixel SP_G. The red sub-pixel SP_R includes a red light-emitting area EA_R, the white sub-pixel SP_W includes a white light-emitting area EA_W, the blue sub-pixel SP_B includes a blue light-emitting area EA_B, the green sub-pixel SP_G includes a green light-emitting area EA_G.

The organic light-emitting display apparatus according to an embodiment of the present disclosure includes a substrate 101, a driving thin-film transistor DTr, an organic light-emitting element 120, a bank 130, and a barrier pattern 140. The organic light-emitting element 120 includes an anode electrode 121, an organic light-emitting layer 123 and a cathode electrode 125.

Pixel driving circuits including the driving thin-film transistors DTr may be disposed on the substrate 101. The anode electrode (also referred to as a pixel electrode) 121 connected to the driving thin-film transistor DTr may be disposed in each sub-pixel. The substrate 101 may be made of a flexible material. The substrate 101 may be made of, for example, plastic or thin glass. In order to prevent external light from entering the driving thin-film transistor DTr, a light-blocking layer may be disposed on the substrate 101 so as to overlap the driving thin-film transistor DTr. A buffer layer covering the light-blocking layer may be disposed between the substrate 101 and the driving thin-film transistors DTr. The buffer layer may be composed of an inorganic insulating film, an organic insulating film, or a stack of an inorganic insulating film and an organic insulating film, and may have a single-layer or multi-layer structure.

The insulating layer 110 covering the driving thin-film transistors DTr may be disposed on the substrate 101. The insulating layer 110 may be composed of an inorganic insulating film, an organic insulating film, or a stack of an inorganic insulating film and an organic insulating film, and may have a single-layer or multi-layer structure.

The anode electrodes 121 may be disposed on the insulating layer 110. Each anode electrode 121 may extend through the insulating layer 110 so as to be connected to each driving thin-film transistor DTr. The organic light-emitting display apparatus according to an embodiment of the present disclosure may be embodied as a display apparatus in a top emission scheme in which light emitted from the organic light-emitting layer is emitted toward a top of the organic light-emitting display apparatus through the cathode electrode. The anode electrode 121 may include a metal material with high reflectance such as a stack structure of aluminum and titanium (Ti/Al/Ti), a stack structure of aluminum and indium-tin oxide (ITO) (ITO/Al/ITO), APC alloy, and a stack structure of APC alloy and ITO (ITO/APC/ITO). The APC alloy refers to an alloy of silver (Ag), palladium (Pb), and copper (Cu).

The bank 130 covering edges of each of the anode electrodes 121 may be disposed on the insulating layer 110. The bank 130 serves to define the light-emitting area of each sub-pixel. An area in which the bank 130 is formed does not emit light and thus may be defined as a non-light-emitting area. The bank 130 may be composed of an organic insulating film made of an acryl resin, an epoxy resin, a phenolic resin, a polyamide resin, a polyimide resin, or the like.

Then, the organic light-emitting layer 123 and the cathode electrode 125 may be sequentially stacked in light-emitting areas EA_R, EA_W, EA_B, and EA_G of the sub-pixels SP_R, SP_W, SP_B, and SP_G defined by openings of the bank 130. The organic light-emitting layer 123 and the cathode electrode 125 may not be patterned but may be continuously extend over an entire display area. The cathode electrode 125 may act as a common electrode commonly connected to all organic light-emitting elements 120 of the display area.

The organic light-emitting layer 123 may include a stacked structure of a hole transport layer, a light-emitting layer, and an electron transport layer. Alternatively, the organic light-emitting layer 123 may be configured to include a hole transport layer, a light-emitting layer, and an electron transport layer, as well as a hole blocking layer, a hole injecting layer, an electron blocking layer, and an electron injecting layer. The light-emitting layer emits light via recombination of electrons and holes, and may emit blue light, green light, red light, or ultraviolet light based on a bandgap of the light-emitting layer. Alternatively, the light-emitting layer may be composed of a stack of a plurality light-emitting layers and may emit white light. In this embodiment, the organic light-emitting layer 123 may emit white light.

The organic light-emitting display apparatus according to an embodiment of the present disclosure may be embodied as a display apparatus in a top emission scheme in which light emitted from the organic light-emitting layer is emitted toward a top of the organic light-emitting display apparatus through the cathode electrode. The cathode electrode 125 may be made of a transparent conductive material. The cathode electrode 125 may be made of a transparent metal oxide, for example, indium-tin oxide (ITO) or indium-zinc oxide (IZO). The cathode electrode 125 may include a cathode electrode 125_R disposed in the red sub-pixel SP_R, a cathode electrode 125_W disposed in the white sub-pixel SP_W, a cathode electrode 125_B disposed in the blue sub-pixel SP_B, and a cathode electrode 125_G disposed in the green sub-pixel SP_G. The cathode electrode 125_G disposed in the green sub-pixel SP_G may have a larger thickness than that of the cathode electrodes disposed in each of other sub-pixels. For example, the cathode electrode 125 may include indium-zinc oxide (IZO). The thickness of the cathode electrode 125_G disposed in the green sub-pixel SP_G may be in a range of 1100 to 1500 Å, and may be, for example, 1300 Å. In addition, the thickness of the cathode electrode disposed in each of the other sub-pixels may be in a range of 250 to 350 Å, and, may be, for example, 300 Å.

Figure 7:
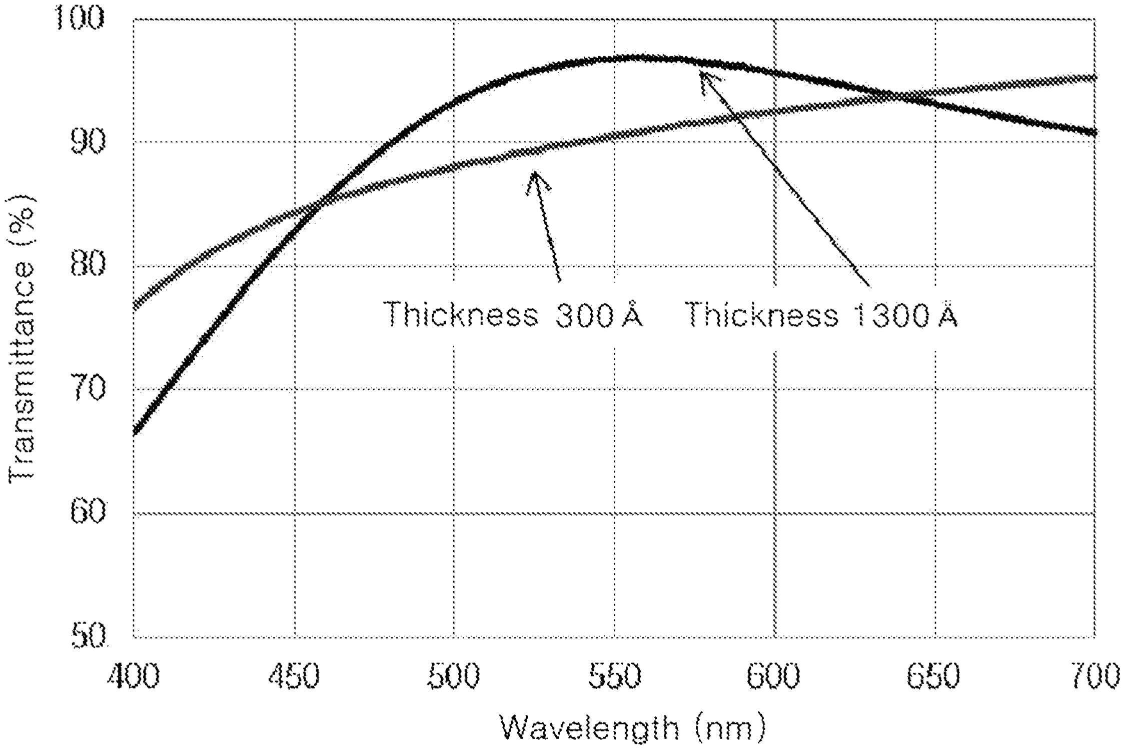
FIG. 7 is a graph showing transmittance based on a thickness of a cathode electrode used in an embodiment of the present disclosure.

For example, FIG. 7 shows change in transmittance in a wavelength range of 400 nm to 700 nm when the cathode electrode 125 is made of indium-zinc oxide (IZO) and the thickness of the cathode electrode 125 is 300 Å or 1300 Å. Referring to FIG. 7, the transmittance in a blue light wavelength band (peak wavelength of 470 nm) when the thickness of the cathode electrode 125 is 300 Å is similar to that when the thickness of the cathode electrode 125 is 1300 Å. The transmittance in a red light wavelength band (peak wavelength of 630 nm) where the thickness of the cathode electrode 125 is 300 Å is similar to that when the thickness of the cathode electrode 125 is 1300 Å. The transmittance in a green light wavelength band (peak wavelength of 550 nm) when the thickness of the cathode electrode 125 is 1300 Å is greater than that when the thickness of the cathode electrode 125 is 300 Å.

In the organic light-emitting display apparatus according to an embodiment of the present disclosure, the cathode electrode 125_G disposed in the green sub-pixel SP_G may have a thickness greater than that of each of the cathode electrodes respectively disposed in the other sub-pixels such that the light-emitting efficiency of the green sub-pixel SP_G may be improved.

The barrier patterns 140 covering the cathode electrode 125 may be respectively disposed in the red sub-pixel SP_R, the white sub-pixel SP_W, and the blue sub-pixel SP_B. The barrier patterns 140 may be disposed on the bank 130. The barrier pattern 140 disposed in the sub-pixel (in this example, the blue sub-pixel SP_B) adjacent to the green sub-pixel SP_G may extend into the green sub-pixel SP_G. The barrier pattern 140 disposed in the sub-pixel (for example, the blue sub-pixel SP_B) adjacent to the green sub-pixel SP_G may have a larger area than that of the barrier pattern 140 located in the sub-pixel (for example, the red or white sub-pixel SP_R or SP_W) not adjacent to the green sub-pixel SP_G.

The barrier pattern 140 may be made of fluoropolymer in which carbon-carbon bonds are continuously arranged in a chain structure (carbon-carbon backbone), and which contains a large amount of fluorine (F) at a functional group thereof. The number of fluorine atoms may amounts up to 50% or more, or 60%, 70%, 80%, or 90% or more of the total number of the atoms of a fluoropolymer.

A following Chemical Formula 1 shows a chemical structural formula of a fluoropolymer material containing a large amount of fluorine (F) at a functional group, according to an example of the present disclosure.

Chemical Formula 1

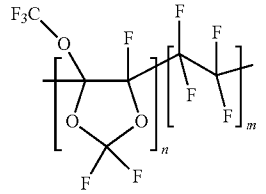

In Chemical Formula 1, n and m represent the number of the repeating units. As shown in the above Chemical Formula 1, the fluoropolymer used as a material for the barrier pattern 140 according to the present disclosure contains a large amount of fluorine (F) at a functional group thereof. The fluoropolymer containing a large amount of fluorine (F) at a functional group has orthogonality. The orthogonality may be understood as a property in which two objects are not related to each other but exist independently of each other. Accordingly, the barrier pattern 140 may have both of a hydrophobic characteristic of having a low affinity with water and an oleophobic characteristic of having a low affinity with oil. Under this orthogonality, the barrier pattern 140 may be separated from moisture or reject the moisture. Accordingly, a path through which moisture permeates may be blocked by the barrier pattern 140.

The organic light-emitting display apparatus according to an embodiment of the present disclosure may further include a dummy cathode electrode 125_S disposed between the barrier patterns 140 in a boundary area between the red sub-pixel SP_R and the white sub-pixel SP_W, and a boundary area between the white sub-pixel SP_W and the blue sub-pixel SP_B. The dummy cathode electrode 125_S may have the same thickness as that of the cathode electrode 125'_G disposed in the green sub-pixel SP_G. The dummy cathode electrode 125_S may be disposed on the bank 130 and may be connected to the cathode electrode 125_G. In an embodiment, the dummy cathode electrode 125_S and the cathode electrode 125_G may not be connected to each other, and the dummy cathode electrode 125_S may be made of a plurality of dummy cathode electrodes spaced apart from each other.

An encapsulation layer (not shown) covering the cathode electrode 125 and the barrier patterns 140 may be disposed on the substrate 101. The encapsulation layer may be composed of an inorganic insulating layer, an organic insulating layer, or a stacked structure thereof. The encapsulation layer may have, for example, a three-layer stacked structure such as an inorganic insulating layer/organic insulating layer/inorganic insulating layer. The encapsulation layer serves to prevent moisture, oxygen, or particles from entering the organic light-emitting display apparatus.

Color filters (not shown) may be disposed on the encapsulation layer. A red color filter may be disposed in the red sub-pixel SP_R, a blue color filter may be disposed in the blue sub-pixel SP_B, and a green color filter may be disposed in the green sub-pixel SP_G.

Hereinafter, a method for manufacturing an organic light-emitting display apparatus according to an embodiment of the present disclosure will be described with reference to the drawings.

FIG. 2A to FIG. 6B are diagrams for illustrating a method for manufacturing an organic light-emitting display apparatus according to an embodiment of the present disclosure. FIGS. 2A, 3A, 4A, 5A, and 6A are plan views for illustrating a method for manufacturing an organic light-emitting display apparatus according to an embodiment of the present disclosure. FIGS. 2B, 3B, 4B, 5B, and 6B are cross-sectional views for illustrating a method for manufacturing an organic light-emitting display apparatus according to an embodiment of the present disclosure.

Figure 2A:
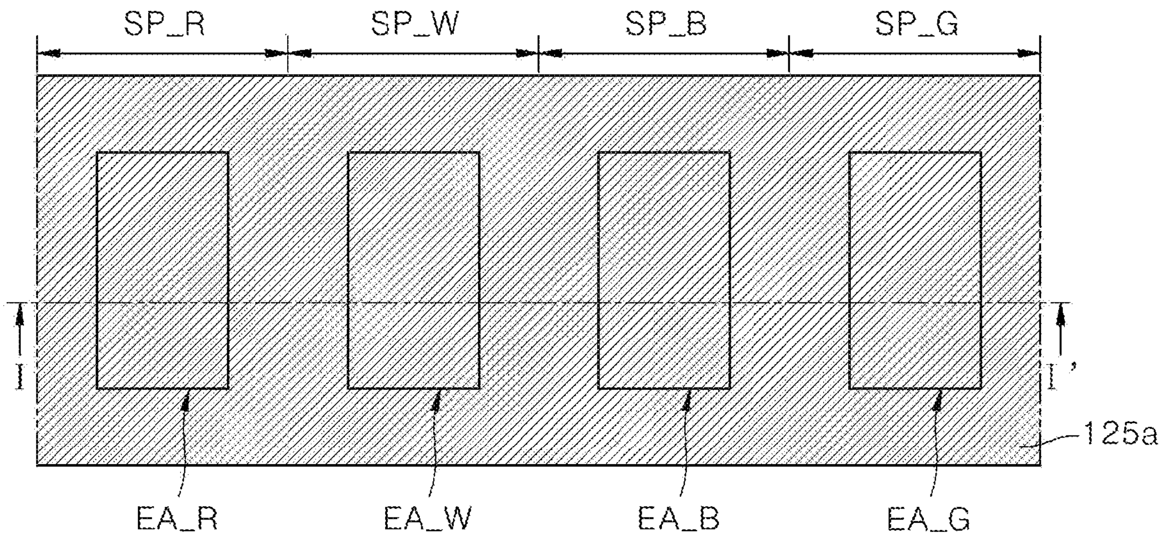
FIGS. 2A and 2B, FIGS. 3A and 3B, FIGS. 4A and 4B, FIGS. 5A and 5B, and FIGS. 6A and 6B are diagrams for illustrating a method for manufacturing an organic light-emitting display apparatus according to an embodiment of the present disclosure.
Figure 2B:
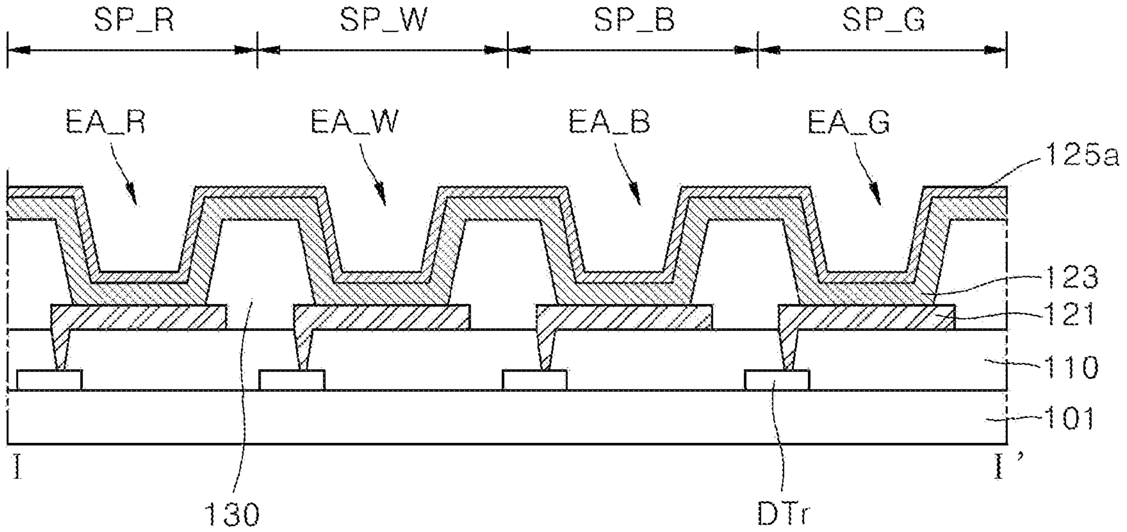

Referring to FIG. 2A and FIG. 2B, the pixel driving circuits including the driving thin-film transistors DTr may be formed on the substrate 101. The substrate 101 may be made of a flexible material. The substrate 101 may be made of, for example, plastic or thin glass. In order to prevent external light from entering the driving thin-film transistor DTr, the light-blocking layer may be disposed on the substrate 101 so as to overlap the driving thin-film transistor DTr.

The buffer layer covering the light-blocking layer may be disposed between the substrate 101 and the driving thin-film transistors DTr. The buffer layer may be composed of an inorganic insulating film, an organic insulating film, or a stack of an inorganic insulating film and an organic insulating film, and may have a single-layer or multi-layer structure.

The insulating layer 110 covering the driving thin-film transistors DTr may be formed on the substrate 101. The insulating layer 110 may be composed of an inorganic insulating film, an organic insulating film, or a stack of an inorganic insulating film and an organic insulating film, and may have a single-layer or multi-layer structure.

In addition, the anode electrodes 121 may be formed on the insulating layer 110, and each anode electrode 121 may extend through the insulating layer 110 so as to be connected to each driving thin-film transistor DTr. The anode electrode 121 may include a metal material with high reflectance such as a stack structure of aluminum and titanium (Ti/Al/Ti), a stack structure of aluminum and indium-tin oxide (ITO) (ITO/Al/ITO), APC alloy, and a stack structure of APC alloy and ITO (ITO/APC/ITO). The APC alloy refers to an alloy of silver (Ag), palladium (Pb), and copper (Cu).

The bank 130 covering each of both opposing edges of each of the anode electrodes 121 may be disposed on the insulating layer 110. The bank 130 serves to define the light-emitting area of each sub-pixel. An area in which the bank 130 is formed does not emit light and thus may be defined as a non-light-emitting area. The bank 130 may be composed of an organic insulating film made of an acryl resin, an epoxy resin, a phenolic resin, a polyamide resin, a polyimide resin, or the like.

Then, the organic light-emitting layer 123 and a first cathode electrode 125*a* may be sequentially stacked in light-emitting areas EA_R, EA_W, EA_B, and EA_G of the sub-pixels SP_R, SP_W, SP_B, and SP_G defined by openings of the bank 130.

The organic light-emitting layer 123 and the first cathode electrode 125*a* may not be patterned but may be continuously extend over an entire display area. The first cathode electrode 125*a* may act as a common electrode commonly connected to all organic light-emitting elements 120 of the display area. The organic light-emitting layer 123 may include a stacked structure of a hole transport layer, a light-emitting layer, and an electron transport layer. Alternatively, the organic light-emitting layer 123 may be configured to include a hole transport layer, a light-emitting layer, and an electron transport layer, as well as a hole blocking layer, a hole injecting layer, an electron blocking layer, and an electron injecting layer. The light-emitting layer emits light via recombination of electrons and holes, and may emit blue light, green light, red light, or ultraviolet light based on a bandgap of the light-emitting layer. Alternatively, the light-emitting layer may be composed of a stack of a plurality light-emitting layers and may emit white light. In this embodiment, the organic light-emitting layer 123 may emit white light.

The first cathode electrode 125*a* may be formed using a physical vapor deposition process, for example, a sputtering process. The first cathode electrode 125*a* may be made of a transparent conductive material. The first cathode electrode 125*a* may be made of a transparent metal oxide, for example, indium-tin oxide (ITO) or indium-zinc oxide (IZO). For example, the first cathode electrode 125*a* may be made of indium-zinc oxide (IZO) and may have a thickness in a range of 250 to 350 Å, for example, 300 Å.

Figure 3A:
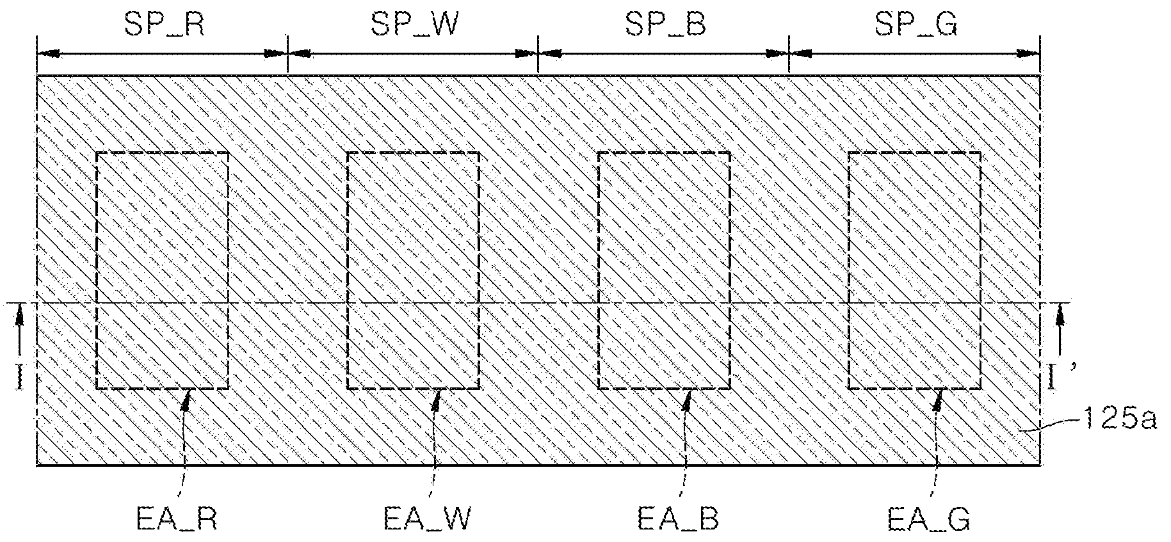
Figure 3B:
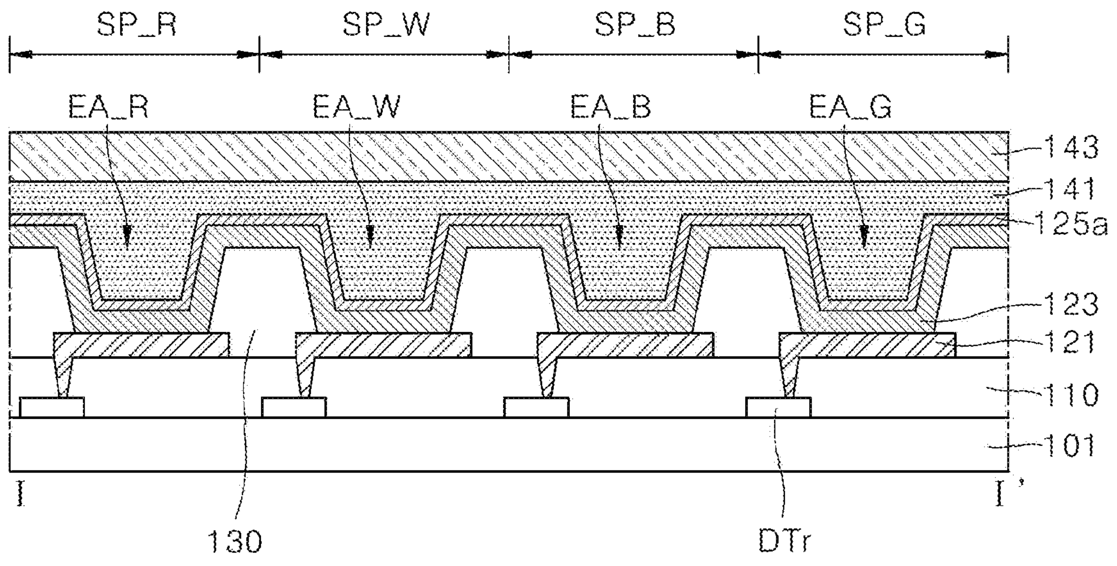

Referring to FIG. 3A and FIG. 3B, a barrier layer 141 covering the first cathode electrode 125*a* and a mask layer 143 covering the barrier layer 141 may be sequentially formed over an entire face of the substrate 101. First, the barrier layer 141 may be formed to fill spaces of the light-emitting areas EA_R, EA_W, EA_B, and EA_G, and to cover the bank 130. The barrier layer 141 may be formed to have a flat top face. Subsequently, the mask layer 143 may be formed by applying a photoresist material on the barrier layer 141.

The barrier layer 141 may be made of fluoropolymer in which carbon-carbon bonds are continuously arranged in a chain structure (carbon-carbon backbone), and which contains a large amount of fluorine (F) at a functional group thereof.

A following Chemical Formula 1 shows a chemical structural formula of a fluoropolymer material containing a large amount of fluorine (F) at a functional group, according to an example of the present disclosure.

Chemical Formula 1

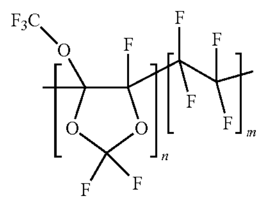

As shown in the above Chemical Formula 1, the fluoropolymer used as a material for the barrier layer 141 according to the present disclosure contains a large amount of fluorine (F) at a functional group thereof. The fluoropolymer containing a large amount of fluorine (F) at a functional group has orthogonality.

Figure 4A:
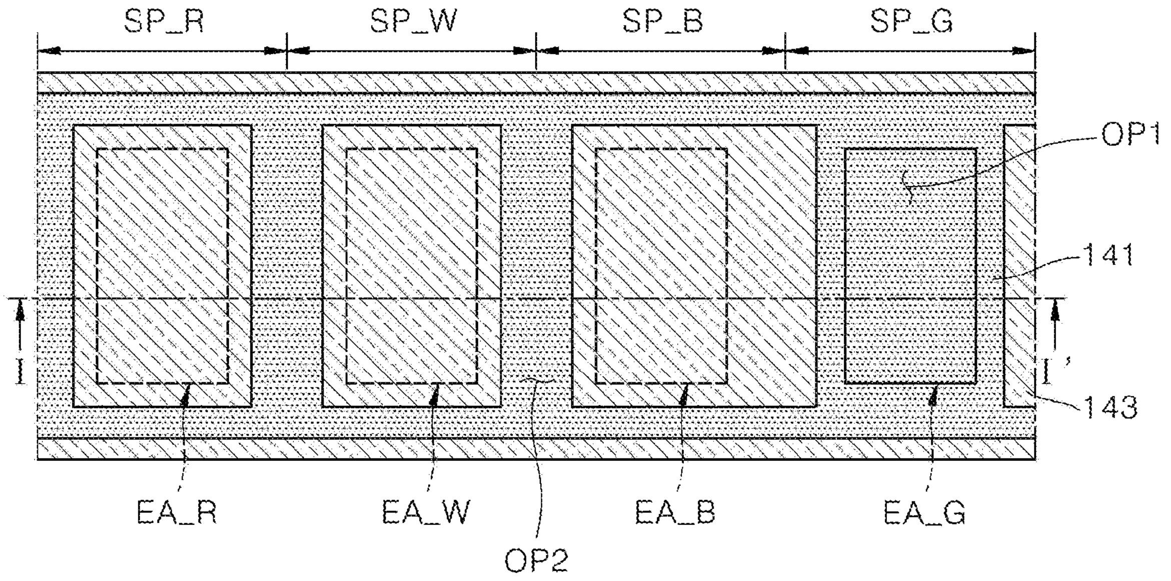
Figure 4B:
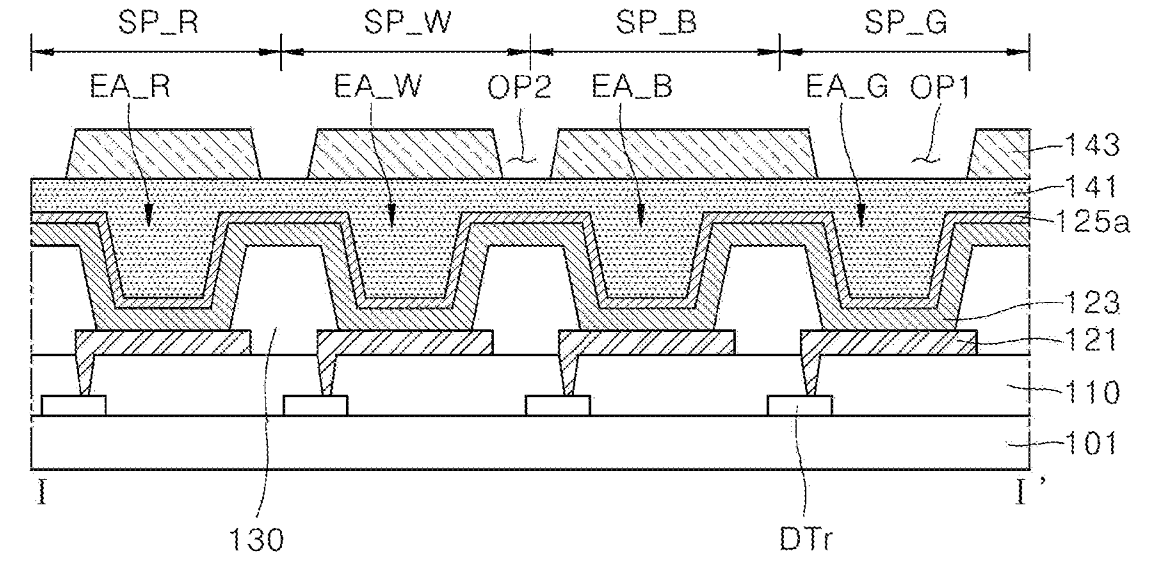

Referring to FIG. 4A and FIG. 4B, a first opening OP1 and a second opening OP2 may be formed in the mask layer 143 in an exposure and development process. The first opening OP1 may be formed in the green sub-pixel SP_G. The first opening OP1 may have a larger area size than that of the green light-emitting area EA_G. The second opening OP2 may be formed in a boundary area between the red sub-pixel SP_R and the white sub-pixel SP_W, and in a boundary area between the white sub-pixel SP_W and the blue sub-pixel SP_B. When the mask layer 143 is removed in a subsequent lift-off process, the second opening OP2 facilitates invasion of an organic solvent, thereby preventing the mask layer 143 from remaining. The second opening OP2 may extend on the bank 130 and may be connected to the first opening OP1. In an embodiment, the first opening OP1 and the second opening OP2 may not be connected to each other, and the second opening OP2 may be divided into a plurality of openings spaced apart from each other.

Figure 5A:
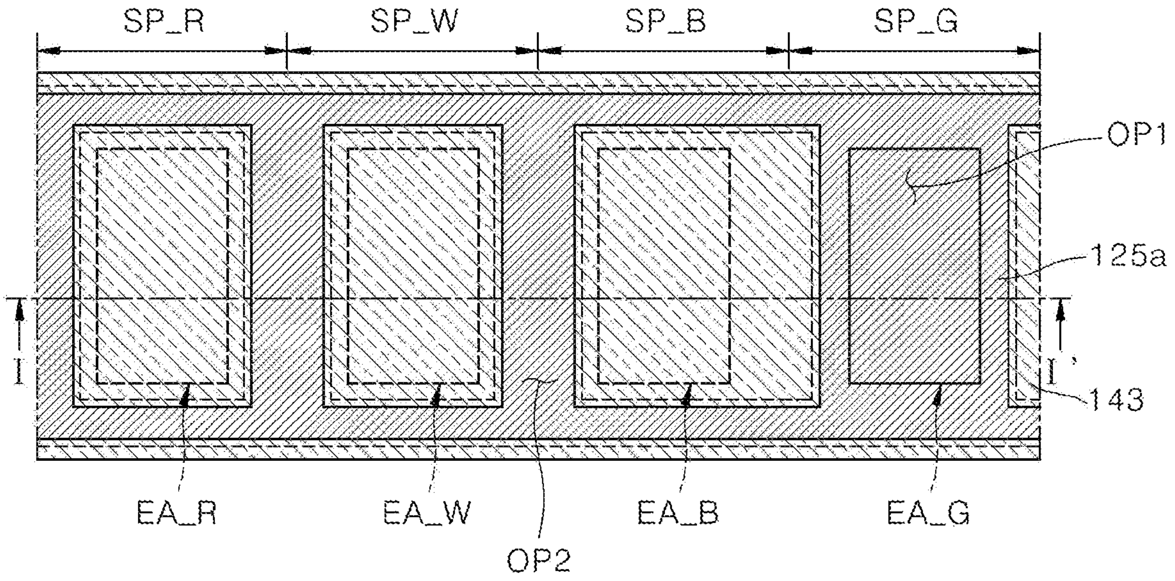
Figure 5B:
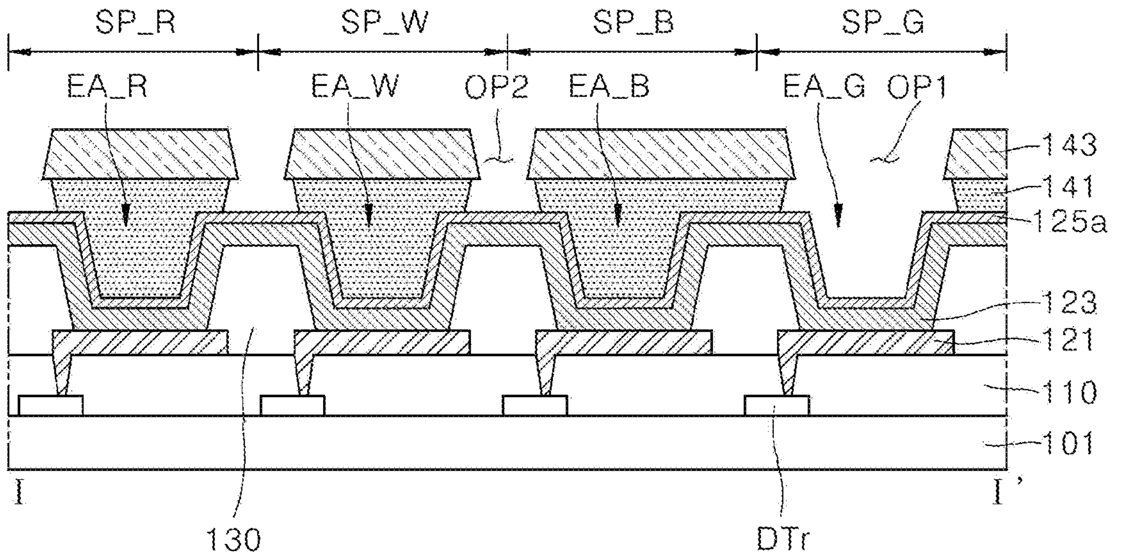

Referring to FIG. 5A and FIG. 5B, an etching process is performed using the mask layer 143 having the first opening OP1 and the second opening OP2 as an etching mask. Thus, portions of the barrier layer 141 exposed through the first opening OP1 and the second opening OP2 may be removed. The portions of the barrier layer 141 under the first opening OP1 and the second opening OP2 may be entirely removed to expose the first cathode electrode 125*a*. The first cathode electrode 125*a* may be exposed in the green sub-pixel SP_G, in the boundary area between the red sub-pixel SP_R and the white sub-pixel SP_W, and in the boundary area between the white sub-pixel SP_W and the blue sub-pixel SP_B.

The etching process may be a wet etching process using a fluorine (F)-based organic solvent. An isotropic wet etching process may allow a portion of the barrier layer 141 to be etched away horizontally to form an undercut structure in which the mask layer 143 protrudes horizontally and outwardly beyond the barrier layer 141.

The lift-off process may be performed using a fluorine (F)-based organic solvent. The fluorine (F)-based organic solvent may include a monomolecular or polymeric material in which carbon-carbon bonds are continuously arranged in a chain structure (carbon-carbon backbone), and which contains a large amount of fluorine (F) at a functional group thereof.

A following Chemical Formula 2 shows a chemical structural formula of the fluorine (F)-based organic solvent according to an example.

Chemical Formula 2

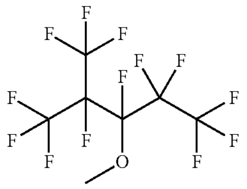

As shown in the above Chemical Formula 2, the fluorine (F)-based organic solvent according to an example of the present disclosure contains a large amount of fluorine (F) at a functional group. The fluorine (F)-based organic solvent containing a large amount of fluorine (F) at the functional group may invade into and selectively remove the barrier layer 141 which is made of the fluoropolymer material that contains a large amount of fluorine (F) at the functional group thereof.

Figure 6A:
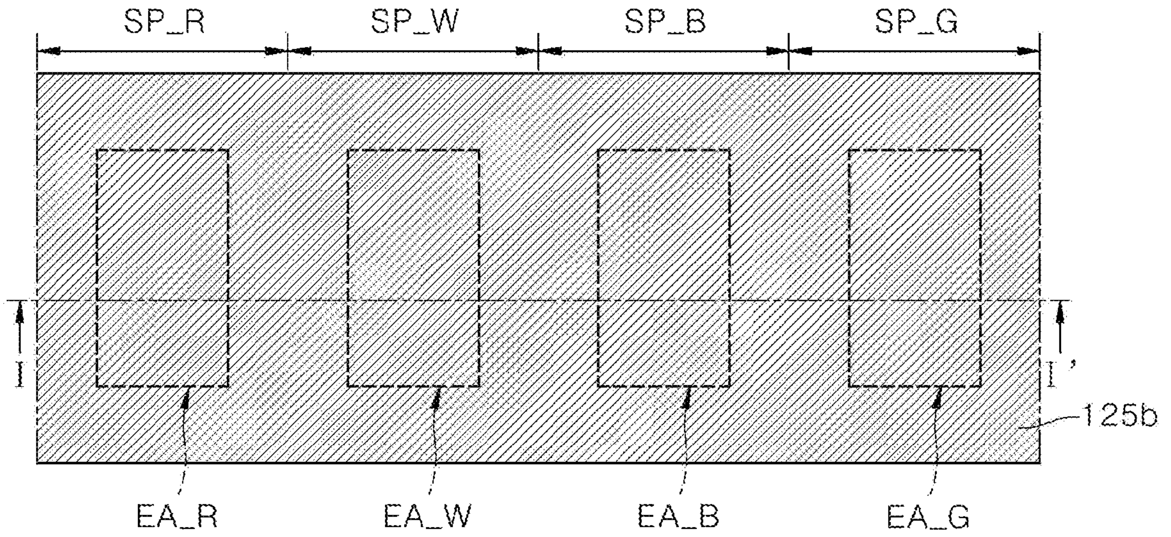
Figure 6B:
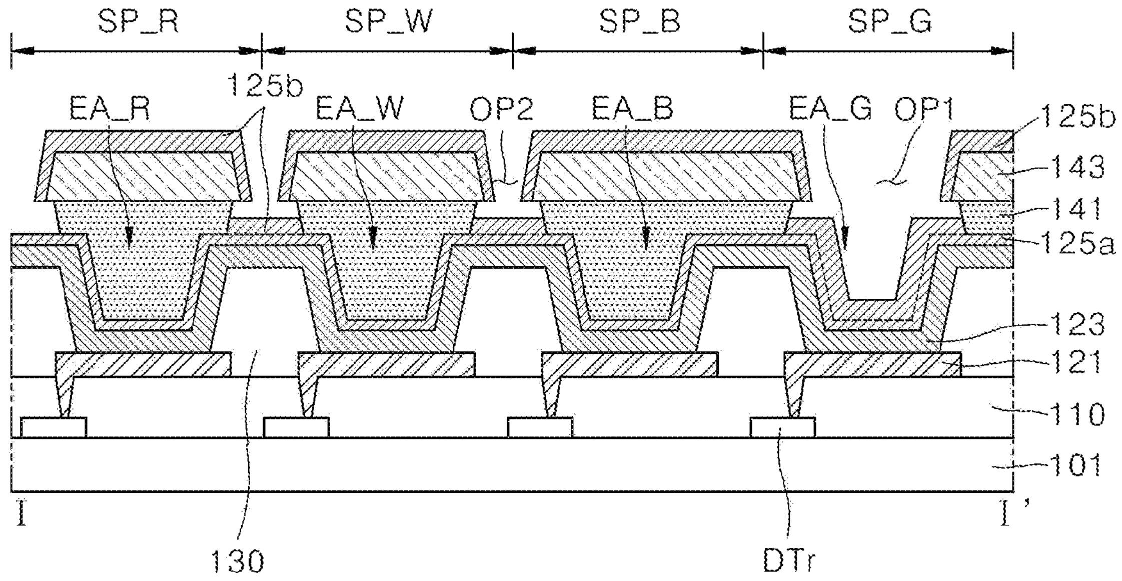

Referring to FIG. 6A and FIG. 6B, a second cathode electrode 125*b* may be formed on partial areas of the first cathode electrode 125*a* and on the mask layer 143. The second cathode electrode 125*b* may be formed using a physical vapor deposition process, for example, a sputtering process. The second cathode electrode 125*b* is formed on the first cathode electrode 125*a* of the green sub-pixel SP_G through the first opening OP1 of the mask layer 143. The second cathode electrode 125*b* is formed on the first cathode electrode 125*a* in the boundary area between the red sub-pixel SP_R and the white sub-pixel SP_W and in the boundary area between the blue sub-pixel SP_B and the white sub-pixel SP_W through the second opening OP2 of the mask layer 143. The second cathode electrode 125*b* may be made of a transparent metal oxide such as, for example, indium-tin oxide (ITO) or indium zinc oxide (IZO). For example, the second cathode electrode 125*b* may be made of indium zinc oxide (IZO) and may have a thickness in a range of 850 to 1150 Å, for example, 1000 Å.

The first cathode electrode 125*a* and the second cathode electrode 125*b* disposed in the green sub-pixel SP_G may constitute the cathode electrode 125_G. The first cathode electrode 125*a* disposed in the red sub-pixel SP_G may constitute the cathode electrode 125_R. The first cathode electrode 125*a* disposed in the white sub-pixel SP_W may constitute the cathode electrode 125_W. The first cathode electrode 125*a* disposed in the blue sub-pixel SP_B may constitute the cathode electrode 125_B. The first cathode electrode 125*a* and the second cathode electrode 125*b* disposed in each of the boundary area between the red sub-pixel SP_R and the white sub-pixel SP_W and the boundary area between the white sub-pixel SP_W and the blue sub-pixel SP_B may constitute the dummy cathode electrode 125_S.

Again, referring to FIGS. 1A and 1B, the barrier patterns 140 may be respectively formed on the cathode electrode 125_R, the cathode electrode 125_W, and the cathode electrode 125_B in a lift-off process to remove the mask layer. The lift-off process for removing the mask layer 143 may be performed using the fluorine (F)-based organic solvent. In this regard, an immersion time for which the substrate 101 including the mask layer 143 and the barrier layer 141 formed thereon is immersed in the fluorine-based organic solvent may be controlled such that the barrier layer 141 is not entirely removed but remains. Thus, the barrier pattern 140 may be formed on each of the cathode electrode 125_R, the cathode electrode 125_W and the cathode electrode 125_B.

The lift-off process may be performed using a fluorine (F)-based organic solvent. The fluorine (F)-based organic solvent may include a monomolecular or polymeric material in which carbon-carbon bonds are continuously arranged in a chain structure (carbon-carbon backbone), and which contains a large amount of fluorine (F) at a functional group thereof.

Next, an encapsulation layer (not shown) covering the cathode electrode 125 and the barrier patterns 140 may be formed on the substrate 101. The encapsulation layer may be composed of an inorganic insulating layer, an organic insulating layer, or a stacked structure thereof. The encapsulation layer may have, for example, a three-layer stacked structure such as an inorganic insulating layer/organic insulating layer/inorganic insulating layer. The encapsulation layer serves to prevent moisture, oxygen, or particles from entering the organic light-emitting display apparatus.

Then, color filters (not shown) may be formed on the encapsulation layer. A red color filter may be formed in the red sub-pixel SP_R, a blue color filter may be formed in the blue sub-pixel SP_B, and a green color filter may be formed in the green sub-pixel SP_G.

In the above-described embodiments, an example in which the thickness of the cathode electrode 125_G disposed in the green sub-pixel SP_G is larger than the thickness of each of the cathode electrodes 125_R, 125_W, and 125_B respectively disposed in the sub-pixels SP_R, SP_W, and SP_B of the other sub-pixels has been described. However, in one embodiment, each of the thickness of the cathode electrode 125_G disposed in the green sub-pixel SP_G and the thickness of the cathode electrode 125_W disposed in the white sub-pixel SP_W may be larger than the thickness of each of the cathode electrodes 125_R and 125_B respectively disposed in the red and blue sub-pixels SP_R and SP_B. In addition, the thickness of the cathode electrode 125_G disposed in the green sub-pixel SP_G may be equal to the thickness of the cathode electrode 125_W disposed in the white sub-pixel SP_W.

In an organic light-emitting display apparatus according to an embodiment of the present disclosure, each of the thickness of the cathode electrode 125_G disposed in the green sub-pixel SP_G and the thickness of the cathode electrode 125_W disposed in the white sub-pixel SP_W may be larger than the thickness of each of the cathode electrodes 125_R and 125_B respectively disposed in the red and blue sub-pixels SP_R and SP_B, such that the light-emitting efficiency of each of the green sub-pixel SP_G and the white sub-pixel SP_W may be improved.

The organic light-emitting display apparatus in which each pixel includes 4 sub-pixels, for example, the red sub-pixel SP_R, the white sub-pixel SP_W, the blue sub-pixel SP_B, and the green sub-pixel SP_G has been described above. However, the present disclosure is not limited thereto. In an embodiment, the organic light-emitting display apparatus may not include white sub-pixel SP_W, but may include the red sub-pixel SP_R, the blue sub-pixel SP_B, and green sub-pixel SP_G.

A display apparatus and a method for manufacturing the same according to embodiments of the present disclosure may be described as follows.

A first aspect of the present disclosure provides an organic light-emitting display apparatus comprising: a pixel including a first sub-pixel, a second sub-pixel, a third sub-pixel and a fourth sub-pixel; wherein each of the first to fourth sub-pixels includes an organic light-emitting element including an anode electrode, an organic light-emitting layer disposed on the anode electrode, and a cathode electrode disposed on the organic light-emitting layer, wherein a thickness of the cathode electrode disposed in the fourth sub-pixel is larger than a thickness of the cathode electrode disposed in each of the first to third sub-pixels.

In one implementation of the first aspect, the first sub-pixel emits red light, the second sub-pixel emits white light, the third sub-pixel emits blue light, and the fourth sub-pixel emits green light.

In one implementation of the first aspect, the cathode electrode is made of indium zinc oxide (IZO), wherein the thickness of the cathode electrode disposed in the fourth sub-pixel is in a range of 1100 to 1500 Å, while the thickness of the cathode electrode disposed in each of the first to third sub-pixels is in a range of 250 to 350 Å.

In one implementation of the first aspect, the organic light-emitting display apparatus further comprises a barrier pattern covering the cathode electrode and disposed in each of the first to third sub-pixels.

In one implementation of the first aspect, each of the barrier patterns is made of fluoropolymer containing a substantial amount of fluorine (F).

In one implementation of the first aspect, the organic light-emitting display apparatus further comprises a dummy cathode electrode disposed in each of a boundary area between the first sub-pixel and the second sub-pixel, and a boundary area between the second sub-pixel and the third sub-pixel, wherein the dummy cathode electrode is disposed between the barrier patterns adjacent to each other.

In one implementation of the first aspect, a thickness of the dummy cathode electrode is equal to the thickness of the cathode electrode disposed in the fourth sub-pixel.

In one implementation of the first aspect, each of the thickness of the cathode of the second sub-pixel and the thickness of the cathode of the fourth sub-pixel is larger than each of the thickness of the cathode of the first sub-pixel and the thickness of the cathode of the third sub-pixel.

A second aspect of the present disclosure provides an organic light-emitting display apparatus comprising: a pixel including a first sub-pixel, a second sub-pixel and a third sub-pixel, wherein each of the first to third sub-pixels includes an organic light-emitting element including an anode electrode, an organic light-emitting layer disposed on the anode electrode, and a cathode electrode disposed on the organic light-emitting layer, wherein the organic light-emitting display apparatus comprises a barrier pattern covering the cathode electrode and disposed in each of the first and second sub-pixels.

In one implementation of the second aspect, each of the barrier patterns is made of fluoropolymer containing a substantial amount of fluorine (F).

In one implementation of the second aspect, a thickness of the cathode electrode disposed in the third sub-pixel is larger than a thickness of the cathode electrode disposed in each of the first and second sub-pixels.

In one implementation of the second aspect, the first sub-pixel emits red light, the second sub-pixel emits blue light, and the third sub-pixel emits green light.

In one implementation of the second aspect, the cathode electrode is made of indium zinc oxide (IZO), wherein the thickness of the cathode electrode disposed in the third sub-pixel is in a range of 1100 to 1500 Å, while a thickness of the cathode electrode disposed in each of the first and second sub-pixels is in a range of 250 to 350 Å.

A third aspect of the present disclosure provides a method of manufacturing an organic light-emitting display apparatus, the method comprising: providing a substrate; forming a plurality of anode electrodes on the substrate so as to be respectively disposed in a plurality of sub-pixels; forming an organic light-emitting layer on the plurality of anode electrodes; forming a first cathode electrode on the organic light-emitting layer; forming a barrier layer on the first cathode electrode; forming a mask layer on the barrier layer; forming a first opening and second openings in the mask layer such that the first opening corresponds to one sub-pixel of the plurality of sub-pixels and each of the second openings correspond to each of boundary areas between adjacent ones of remaining sub-pixels of the plurality of sub-pixels; removing portions of the barrier layer respectively exposed through the first opening and the second openings to expose partial areas of the first cathode electrode; and forming a second cathode electrode on the partial areas of the first cathode electrode respectively exposed through the first opening and the second openings.

In one implementation of the third aspect, said one sub-pixel of the plurality of sub-pixels emits green light.

In one implementation of the third aspect, each of the first and second cathode electrodes is made of indium zinc oxide (IZO), wherein a thickness of the first cathode electrode is in a range of 250 to 350 Å, and a thickness of the second cathode electrode is in a range of 850 to 1150 Å.

In one implementation of the third aspect, the barrier layer is made of fluoropolymer containing a substantial amount of fluorine (F).

In one implementation of the third aspect, the method further comprises performing a lift-off process to remove the mask layer and form barrier patterns respectively in the remaining sub-pixels of the plurality of sub-pixels.

In one implementation of the third aspect, the lift-off process is performed using a fluorine-based organic solvent.

A fourth aspect of the present disclosure provides an organic light-emitting display apparatus comprising: a pixel including a red sub-pixel, a blue sub-pixel and a green sub-pixel, wherein each of the red sub-pixel, the blue sub-pixel and the green sub-pixel includes an organic light-emitting element including an anode electrode, an organic light-emitting layer disposed on the anode electrode, and a cathode electrode disposed on the organic light-emitting layer, wherein a thickness of the cathode electrode disposed in the green sub-pixel is larger than a thickness of the cathode electrode disposed in each of the red sub-pixel and the blue sub-pixel.

In one implementation of the fourth aspect, the pixel of the organic light-emitting display apparatus further includes a white sub-pixel, and the white sub-pixel includes an organic light-emitting element including an anode electrode, an organic light-emitting layer disposed on the anode electrode, and a cathode electrode disposed on the organic light-emitting layer.

In one implementation of the fourth aspect, a thickness of the cathode electrode disposed in the green sub-pixel is larger than a thickness of the cathode electrode disposed in the white sub-pixel.

In one implementation of the fourth aspect, each of the thickness of the cathode electrode disposed in the green sub-pixel and the thickness of the cathode electrode disposed in the white sub-pixel is larger than the thickness of each of the cathode electrodes respectively disposed in the red sub-pixel and blue sub-pixel.

In one implementation of the fourth aspect, a thickness of the cathode electrode disposed in the green sub-pixel is equal to a thickness of the cathode electrode disposed in the white sub-pixel.

In one implementation of the fourth aspect, the thickness of the cathode electrode disposed in the green sub-pixel is in a range of 1100 to 1500 Å, while the thickness of the cathode electrode disposed in each of the red sub-pixel and the blue sub-pixel is in a range of 250 to 350 Å.

In one implementation of the fourth aspect, the organic light-emitting display apparatus comprises a barrier pattern covering the cathode electrode disposed in each of the red sub-pixel and the blue sub-pixel.

In one implementation of the fourth aspect, the barrier layer is made of fluoropolymer.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure, the scope of the technical idea of the present disclosure is not limited by the embodiments. Therefore, it should be understood that the embodiments as described above are illustrative and non-limiting in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display apparatus comprising:

a pixel including a first sub-pixel, a second sub-pixel, a third sub-pixel, and a fourth sub-pixel, each of the first to fourth sub-pixels including:

an organic light-emitting element including:

an anode electrode, an organic light-emitting layer disposed on the anode electrode, and a cathode electrode disposed on the organic light-emitting layer, a barrier pattern disposed in each of the first to third sub-pixels;

a bank disposed between the second sub-pixel and the third sub-pixel and between the third sub-pixel and the fourth sub-pixel; and a dummy electrode disposed on the bank and laterally between the second sub-pixel and the third sub-pixel and laterally surrounding the barrier pattern, the dummy electrode extending upwardly beyond the barrier pattern wherein a thickness of the cathode electrode disposed in the fourth sub-pixel is larger than a thickness of the cathode electrode disposed in each of the first to third sub-pixels, wherein a thickness of the dummy electrode is larger than the thickness of the cathode electrode disposed in each of the first to third sub-pixels, wherein the barrier pattern disposed in the third sub-pixel has a top surface, a bottom surface opposite the top surface, and a side surface between the top surface and the bottom surface, wherein the barrier pattern disposed in the third sub-pixel extends from the third sub-pixel over the bank to the fourth sub-pixel, wherein the cathode electrode disposed in the fourth sub-pixel is in contact with the bottom surface and the side surface of the barrier pattern disposed in the third sub-pixel, and wherein a top surface of the cathode electrode disposed in the fourth sub-pixel is positioned above the top surface of the barrier pattern disposed in the third sub-pixel at the bank.

2. The organic light-emitting display apparatus of claim 1, wherein the first sub-pixel emits red light, the second sub-pixel emits white light, the third sub-pixel emits blue light, and the fourth sub-pixel emits green light.

3. The organic light-emitting display apparatus of claim 1, wherein the cathode electrode is made of indium zinc oxide, and wherein the thickness of the cathode electrode disposed in the fourth sub-pixel is in a range of 1100 Å to 1500 Å, and the thickness of the cathode electrode disposed in each of the first to third sub-pixels is in a range of 250 Å to 350 Å.

4. The organic light-emitting display apparatus of claim 1, wherein the barrier pattern covers the cathode electrode.

5. The organic light-emitting display apparatus of claim 4, wherein each of the barrier patterns is made of fluoropolymer.

6. The organic light-emitting display apparatus of claim 4, wherein the organic light-emitting display apparatus further comprises a dummy cathode electrode disposed in each of a boundary area between the first sub-pixel and the second sub-pixel, and a boundary area between the second sub-pixel and the third sub-pixel, wherein the dummy cathode electrode is disposed between the barrier patterns adjacent to each other.

7. The organic light-emitting display apparatus of claim 6, wherein a thickness of the dummy cathode electrode is equal to the thickness of the cathode electrode disposed in the fourth sub-pixel.

8. An organic light-emitting display apparatus comprising:

a pixel including a first sub-pixel, a second sub-pixel, and a third sub-pixel;

a barrier pattern disposed in each of the first to third sub-pixels;

a dummy electrode disposed laterally between the first sub-pixel and the second sub-pixel and laterally surrounding the barrier pattern, wherein each of the first to third sub-pixels includes an organic light-emitting element including an anode electrode, an organic light-emitting layer disposed on the anode electrode, and a cathode electrode disposed on the organic light-emitting layer, wherein the barrier pattern covers the cathode electrode and is disposed in each of the first and second sub-pixels, wherein a thickness of the cathode electrode disposed in the third sub-pixel is larger than a thickness of the cathode electrode disposed in each of the first and second sub-pixels, wherein a thickness of the dummy electrode is larger than the thickness of the cathode electrode disposed in each of the first and second sub-pixels, wherein the barrier pattern disposed in the second sub-pixel has a top surface, a bottom surface opposite the top surface, and a side surface between the top surface and the bottom surface, wherein the cathode electrode disposed in the third sub-pixel is in contact with the bottom surface and the side surface of the barrier pattern disposed in the second sub-pixel, and wherein a top surface of the cathode electrode disposed in the third sub-pixel is positioned above the top surface of the barrier pattern disposed in the second sub-pixel, and a top surface of the dummy electrode is positioned above the top surface of the barrier pattern disposed in the second sub-pixel.

9. The organic light-emitting display apparatus of claim 8, wherein each of the barrier patterns is made of fluoropolymer.

10. The organic light-emitting display apparatus of claim 8, wherein the first sub-pixel emits red light, the second sub-pixel emits blue light, and the third sub-pixel emits green light.

11. The organic light-emitting display apparatus of claim 8, wherein the cathode electrode is made of indium zinc oxide, and wherein the thickness of the cathode electrode disposed in the third sub-pixel is in a range of 1100 Å to 1500 Å, while a thickness of the cathode electrode disposed in each of the first and second sub-pixels is in a range of 250 Å to 350 Å.

12. An organic light-emitting display apparatus comprising:

a substrate having a pixel thereon, the pixel including a red sub-pixel, a blue sub-pixel, and a green sub-pixel, a barrier pattern disposed in each of the red sub-pixel and the blue sub-pixel;

a dummy electrode disposed laterally between the red sub-pixel and the blue sub-pixel and laterally surrounding the barrier pattern, the dummy electrode extending upwardly beyond the barrier pattern, wherein each of the red sub-pixel, the blue sub-pixel, and the green sub-pixel includes an organic light-emitting element including an anode electrode, an organic light-emitting layer disposed on the anode electrode, and a cathode electrode disposed on the organic light-emitting layer, wherein each cathode electrode includes a first surface and a second surface opposite the first surface, wherein each cathode electrode has a trench shape in cross-section, and the first surface is defined at a lowest region of the trench, the second surface being opposite the first surface and positioned closer to the substrate than the first surface, wherein a thickness of the dummy electrode is larger than a thickness of the cathode electrode disposed in each of the red sub-pixel and the blue sub-pixel, and wherein the first surface of the cathode electrode disposed in the green sub-pixel is positioned above the first surface of the cathode electrode disposed in each of the red sub-pixel and the blue sub-pixel.

13. The organic light-emitting display apparatus of claim 12, wherein the pixel further includes a white sub-pixel, the white sub-pixel includes an organic light-emitting element including an anode electrode, an organic light-emitting layer disposed on the anode electrode, and a cathode electrode disposed on the organic light-emitting layer.

14. The organic light-emitting display apparatus of claim 13, wherein a thickness of the cathode electrode disposed in the green sub-pixel is larger than a thickness of the cathode electrode disposed in the white sub-pixel.

15. The organic light-emitting display apparatus of claim 13, wherein the thickness of the cathode electrode disposed in the green sub-pixel is larger than the thickness of each of the cathode electrodes respectively disposed in the red sub-pixel and the blue sub-pixel.

16. The organic light-emitting display apparatus of claim 13, wherein a thickness of the cathode electrode disposed in the red sub-pixel is equal to a thickness of the cathode electrode disposed in the blue sub-pixel.

17. The organic light-emitting display apparatus of claim 12, wherein the thickness of the cathode electrode disposed in the green sub-pixel is in a range of 1100 Å to 1500 Å, and the thickness of the cathode electrode disposed in each of the red sub-pixel and the blue sub-pixel is in a range of 250 Å to 350 Å.

18. The organic light-emitting display apparatus of claim 12, wherein the barrier pattern covers the cathode electrode disposed in each of the red sub-pixel and the blue sub-pixel.

* * * * *